(12) United States Patent
Sekar et al.

(10) Patent No.: US 8,637,845 B2
(45) Date of Patent: Jan. 28, 2014

(54) OPTIMIZED ELECTRODES FOR RE-RAM

(75) Inventors: Deepak C. Sekar, Sunnyvale, CA (US);
April Schricker, Fremont, CA (US);
Xiying Chen, San Jose, CA (US); Klaus Schuegraf, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/553,411

(22) Filed: Jul. 19, 2012

(65) Prior Publication Data

US 2012/0280201 A1    Nov. 8, 2012

Related U.S. Application Data

(62) Division of application No. 12/364,732, filed on Feb. 3, 2009, now Pat. No. 8,263,420.

(60) Provisional application No. 61/113,850, filed on Nov. 12, 2008.

(51) Int. Cl.
*H01L 47/00*     (2006.01)

(52) U.S. Cl.
USPC ............. 257/4; 257/2; 257/5; 257/E45.002; 257/E45.003; 365/148; 365/164; 365/174; 365/175

(58) Field of Classification Search
USPC .............. 257/2, 4, 5, E45.002, E45.003; 365/148, 164, 174, 175
See application file for complete search history.

(56) References Cited

U.S. PATENT DOCUMENTS

| 6,856,536 | B2 | 2/2005 | Rinerson et al. |
| 7,029,924 | B2 | 4/2006 | Hsu et al. |
| 7,067,862 | B2 | 6/2006 | Rinerson et al. |
| 7,148,533 | B2 | 12/2006 | Hsu et al. |
| 7,400,006 | B1 | 7/2008 | Rinerson et al. |
| 7,538,338 | B2 | 5/2009 | Rinerson et al. |
| 7,580,276 | B2 | 8/2009 | Sawa et al. |
| 7,733,684 | B2 * | 6/2010 | Kubo et al. .................. 365/148 |
| 7,764,160 | B2 | 7/2010 | Kawano et al. |

(Continued)

FOREIGN PATENT DOCUMENTS

| JP | 2007088349 A | 4/2007 |
| WO | WO2006/101152 A1 | 9/2006 |
| WO | WO2008/038365 A1 | 4/2008 |

OTHER PUBLICATIONS

Notice of Allowance and Fee(s) Due dated Jul. 20, 2012, filed Feb. 3, 2009, 17 pages.

(Continued)

*Primary Examiner* — Bac Au
(74) *Attorney, Agent, or Firm* — Vierra Magen Marcus LLP

(57) ABSTRACT

Optimized electrodes for ReRAM memory cells and methods for forming the same are discloses. One aspect comprises forming a first electrode, forming a state change element in contact with the first electrode, treating the state change element, and forming a second electrode. Treating the state change element increases the barrier height at the interface between the second electrode and the state change element. Another aspect comprises forming a first electrode in a manner to deliberately establish a certain degree of amorphization in the first electrode, forming a state change element in contact with the first electrode. The degree of amorphization of the first electrode is either at least as great as the degree of amorphization of the state change element or no more than 5 percent less than the degree of amorphization of the state change element.

12 Claims, 10 Drawing Sheets

(56) References Cited

U.S. PATENT DOCUMENTS

| | | | |
|---|---|---|---|
| 8,263,961 B2* | 9/2012 | Osano et al. | 257/4 |
| 8,304,754 B2* | 11/2012 | Sekar et al. | 257/4 |
| 2002/0030945 A1 | 3/2002 | Odagawa et al. | |
| 2004/0214080 A1 | 10/2004 | O'Neil et al. | |
| 2005/0151156 A1 | 7/2005 | Wu et al. | |
| 2005/0214612 A1 | 9/2005 | Visco et al. | |
| 2006/0221510 A1 | 10/2006 | Parkin | |
| 2007/0111894 A1 | 5/2007 | Suzuki | |
| 2007/0132049 A1 | 6/2007 | Stipe | |
| 2007/0285963 A1 | 12/2007 | Toda et al. | |
| 2008/0001172 A1 | 1/2008 | Karg et al. | |
| 2008/0022514 A1 | 1/2008 | Anderson et al. | |
| 2008/0048165 A1 | 2/2008 | Miyazawa | |
| 2008/0149911 A1 | 6/2008 | Karg et al. | |
| 2008/0174400 A1 | 7/2008 | Chen et al. | |
| 2008/0210924 A1 | 9/2008 | Shin | |
| 2008/0293224 A1* | 11/2008 | Son et al. | 438/487 |
| 2009/0008620 A1* | 1/2009 | Baek et al. | 257/2 |
| 2009/0017577 A1* | 1/2009 | An et al. | 438/102 |
| 2009/0026442 A1 | 1/2009 | Cheung et al. | |
| 2009/0095985 A1* | 4/2009 | Lee et al. | 257/211 |
| 2009/0225582 A1 | 9/2009 | Schloss | |
| 2009/0231910 A1* | 9/2009 | Liu et al. | 365/163 |
| 2009/0272961 A1 | 11/2009 | Miller et al. | |
| 2009/0302296 A1 | 12/2009 | Fuchigami et al. | |
| 2010/0117053 A1 | 5/2010 | Sekar et al. | |
| 2010/0117069 A1 | 5/2010 | Sekar et al. | |
| 2010/0239959 A1 | 9/2010 | Lust et al. | |
| 2010/0255387 A1 | 10/2010 | Ramanathan et al. | |
| 2011/0143038 A1 | 6/2011 | Bone et al. | |

OTHER PUBLICATIONS

International Search Report and Written Opinion dated Nov. 26, 2009, International Application No. PCT/US2009/059237, 11 pages.
Office Action dated Dec. 8, 2010, U.S. Appl. No. 12/364,707, filed Feb. 3, 2009, 15 pages.
Response A to Office Action dated Feb. 9, 2011, U.S. Appl. No. 12/364,707, filed Feb. 3, 2009, 19 pages.
Final Office Action dated Mar. 14, 2011, U.S. Appl. No. 12/364,707, filed Feb. 3, 2009, 18 pages.
Response B to Final Office Action dated Apr. 14, 2011, U.S. Appl. No. 12/364,707, filed Feb. 3, 2009, 11 pages.
Office Action dated May 11, 2011, U.S. Appl. No. 12/364,707, filed Feb. 3, 2009, 21 pages.
Response C to Office Action dated Jul. 21, 2011, U.S. Appl. No. 12/364,707, filed Feb. 3, 2009, 14 pages.
Office Action dated Aug. 22, 2011, U.S. Appl. No. 12/364,707, filed Feb. 3, 2009, 12 pages.
Office Action dated Nov. 23, 2011, U.S. Appl. No. 12/364,707, filed Feb. 3, 2009, 14 pages.
Response D to Office Action dated Feb. 17, 2012, U.S. Appl. No. 12/364,707, filed Feb. 3, 2009, 11 pages.
Office Action dated Apr. 9, 2012, U.S. Appl. No. 12/364,707, filed Feb. 3, 2009, 17 pages.
Response E to Office Action dated Jun. 25, 2012, U.S. Appl. No. 12/364,707, filed Feb. 3, 2009, 11 pages.
Office Action Restriction dated Jun. 17, 2011, U.S. Appl. No. 12/364,732, filed Feb. 3, 2009, 7 pages.
Response A to Office Action Restriction dated Jul. 11, 2011, U.S. Appl. No. 12/364,732, filed Feb. 3, 2009, 7 pages.
Office Action dated Sep. 6, 2011, U.S. Appl. No. 12/364,732, filed Feb. 3, 2009, 28 pages.
Response B to Office Action dated Nov. 29, 2011, U.S. Appl. No. 12/364,732, filed Feb. 3, 2009, 12 pages.
Notice of Allowance and Fee(s) due dated Mar. 2, 2012, U.S. Appl. No. 12/364,732, filed Feb. 3, 2009, 15 pages.
Notice of Allowance and Fee(s) due dated May 24, 2012, U.S. Appl. No. 12/364,732, filed Feb. 3, 2009, 13 pages.
Castro et al., "Synthesis and sintering improvement of Aurivillius type structure", Journal of Materials Chemistry, Apr. 1999, vol. 9, p. 1313-1317, 8 pages.
Wang, Yudi, "Alloy perovskite oxide thin film as resistance switching non-volatile memory", Jan. 1, 2008 U. Penn. Dissertation (2008), ISBN: 9780549574941, Dissertations available from ProQuest. Paper AAI3309522. http://repository.upenn.edu/dissertations/AAI3309522, 9 pages.
Email from Irene Clements, Graduate Program Coordinator, University of Pennsylvania Department of Materials Science and Engineering, Feb. 16, 2011, 1 page.
Email from Nick Okrent, University of Pennsylvania Library, Feb. 16, 2011, 1 page.
Pomfret et al., "Structural and Compositional Characterization of Yttria-Stabilized Zirconia: Evidence of Surface-Stabilized, Low-Valence Metal Species." Published on Web Feb. 17, 2005, Analytical Chemistry, vol. 77, No. 6, pp. 1791-1795, 5 pages.
Zha et al., "Effect of Gd (Sm) doping on properties of ceria electrolyte for solid oxide fuel cells," Journal of Power Sources 115, Mar. 2003, Elsevier Science B.V. Publication, pp. 44-48, 5 pages.
Kilner, John A., "Ionic Conductors: Feel the Strain," Nature Materials, Nov. 7, 2008, vol. 7, pp. 838-839, 2 pages.
English Abstract of JP2007088349, Published Apr. 5, 2007, Applicants Fujitsu Ltd., 1 page.

* cited by examiner

| LaMnO₃, TaCN, or TiCN | ZrO_x doped with YO_x | TiN, Ti(O)N, TaN, Ta(O)N |
|---|---|---|
| 108b | 104 | 108a |

Figure 4A

| LaMnO₃, Co oxide, Ni oxide, TaCN, or TiCN | CoO_x | TiN, Ti(O)N, TaN, Ta(O)N |
|---|---|---|
| 108b | 104 | 108a |

Figure 4B

| LaMnO₃, Co oxide, or Ni oxide, TaCN, or TiCN | Bismuth oxide | TiN, Ti(O)N, TaN, Ta(O)N |
|---|---|---|
| 108b | 104 | 108a |

Figure 4C

OPTIMIZED ELECTRODES FOR RE-RAM

CLAIM OF PRIORITY

This application is a divisional application of U.S. patent application Ser. No. 12/364,732, entitled "OPTIMIZED ELECTRODES FOR RE-RAM," filed Feb. 3, 2009, now U.S. Pat. No. 8,263,420, which is incorporated herein by reference in its entirety and which claims the benefit of U.S. Provisional Patent Application Ser. No. 61/113,850, entitled, "OPTIMIZED RE-WRITABLE RAM MATERIALS, DEVICES, AND METHODS FOR FORMING THE SAME," filed Nov. 12, 2008.

CROSS-REFERENCE TO RELATED APPLICATION

The following related application is cross-referenced and incorporated by reference herein in its entirety:

U.S. patent application Ser. No. 12/364,707, entitled "METAL OXIDE MATERIALS AND ELECTRODES FOR RE-RAM."

BACKGROUND OF THE INVENTION

1. Field of the Invention

The present invention relates to storage devices.

2. Description of the Related Art

Materials having a detectable level of change in state, such as a resistance, are used to form various types of non-volatile semiconductor based memory cells. It has been proposed that such memory cells might be used for binary data storage in memory arrays by assigning a lower resistance state of a memory cells to a first logical state such as logical '0,' and assigning a higher resistance state of the memory cell to a second logical state such as logical '1.' Other logical data assignments to resistance states may also be used. Some materials can be reset back to a higher resistance state after being set from an initial state to a lower resistance state. These types of materials can be used to form re-writable memory cells. Multiple levels of detectable resistance in materials might be used to form multi-state memory cells which may or may not be re-writable.

One type of memory cell that exhibits switching behavior between at least two resistance states is referred to as ReRAM for "resistive switching RAM". ReRAM may also be referred to as R-RAM or RRAM. A ReRAM memory cell may include a first electrode, a re-writable switching material (also referred to as a state change element), and a second electrode. The switching material may be metal oxide ($MeO_x$). The ReRAM device may also have a steering device such as a diode electrically in series with the other elements. Switching the memory cell between resistance states may be achieved by applying a voltage across the memory cell. An alternative way of explaining the switching between resistance states is to force a current through the memory cell.

The mechanism by which a ReRAM memory cell switches between resistance states is not completely understood. However, it has been suggested that current paths (in the form of filaments) appear in the $MeO_x$ switching material when a sufficient voltage bias ("set voltage") is applied. The filaments may be broken (reset) by applying a "reset voltage", resulting in higher resistance. The filaments may be due to oxygen vacancies in the $MeO_x$ switching material. These oxygen vacancies may be created, annihilated and moved (from one electrode towards the other) during the set and reset processes. Thus, for some memory cells a "set operation" is used to establish a "set resistance" and a "reset operation" is used to establish a "reset resistance". The reset resistance may be thousands or even millions of times greater than the set resistance.

During the reset operation a certain current flows through the memory cell ("reset current"). Reducing the current that is needed to reset the memory cell may be beneficial in that it may reduce disturb issues and reduce stress on the memory cell. Reducing stress increases the number of set/reset cycles that are possible. Reducing the required reset current can also reduce power requirements.

Note that the desired properties for the first and second electrode may be different from each other due to the asymmetry of operation of the memory cell. For example, during a set operation oxygen vacancies may be created in the $MeO_x$ at the interface between the $MeO_x$ and one of the electrodes. For convenience of discussion, the electrodes will be referred to as "top" and "bottom" electrodes. The terms top and bottom are relative to voltages that are applied to the memory cell during operation. For purposes of discussion the electrode that has a positive voltage (relative to the other electrode) applied to it during a set operation will be referred to as a "top electrode". The other electrode will be referred to as the "bottom electrode."

Various combinations of materials have been proposed for the $MeO_x$ switching material and the electrodes. One possible combination that has been suggested is ZnMnO for the $MeO_x$ switching material with platinum (Pt) or some other conductive $MeO_x$ such as $TiO_x$ as the top electrode and TiN or oxidized TiN as the bottom electrode. Another possibility is a transition $MeO_x$ for the switching material with Pt or some other conductive $MeO_x$ as the top electrode and TiN as the bottom electrode. Still another possibility for the $MeO_x$ switching material is NiO with Pt as the top electrode.

While platinum may be a very effective material for the electrodes, platinum is not a good material for semiconductor fabrication. Therefore, it is desirable to find an alternative to platinum for the electrodes. Moreover, choosing the combination of materials for the $MeO_x$ switching material and the electrodes is a difficult task.

Also, the methods of fabricating the memory cell should be compatible with existing semiconductor fabrication techniques. For example, fabrication of other elements might require the use of high temperatures. In one implementation, fabricating a steering element diode may require annealing at temperatures as high as 750 C. Therefore, the materials for the memory cell should be able to withstand high temperatures.

SUMMARY OF THE INVENTION

Rewritable switching materials and electrodes for ReRAM memory cells and methods for forming the same are described herein. The ReRAM memory cell can be used in a 3D memory cell array. Various materials for a $MeO_x$ switching material are disclosed. Alternatives to platinum for the electrodes are disclosed. Various combinations of suitable electrode material and $MeO_x$ switching materials are disclosed. Materials for memory cells and methods of forming memory cells disclosed herein may improve memory cell performance. Examples of increased performance include reduction of the required reset current, ability to withstand high temperatures, and increased set/reset cycles. Techniques disclosed herein are compatible with existing semiconductor fabrication techniques.

One embodiment is a method for forming a storage device. The method comprises forming a first electrode, forming a state change element in contact with the first electrode, treating the state change element, and forming a second electrode in contact with the state change element. Treating the state change element increases the barrier height at the interface between the second electrode and the state change element.

One embodiment is a method for forming a storage device comprising forming a first electrode in a manner to deliberately establish a degree of amorphization in the first electrode, forming a state change element in contact with the first electrode, and forming a second electrode in contact with the state change element. The degree of amorphization of the first electrode is either at least as great as the degree of amorphization of the state change element or no more than 5 percent less than the degree of amorphization of the state change element.

Another embodiment is a storage device comprising a first electrode a metal-oxide state change element in contact with the first electrode, and a second electrode in contact with the state change element. The second electrode comprises at least one of TiCN or TaCN.

BRIEF DESCRIPTION OF THE DRAWINGS

FIGS. 4A-4C depict embodiments of memory cells that have different combinations of materials for the state change element and the electrodes.

DETAILED DESCRIPTION

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, intervening elements or layers may be present. In contrast, when an element or layer is referred to as being "directly formed on," to another element, there are no intervening elements or layers present. Other words used to describe the relationship between elements or layers should be interpreted in a like fashion (e.g., "in contact with" versus "in direct contact with," "between," versus "directly between," "adjacent," versus "directly adjacent," etc.).

Figure 1:
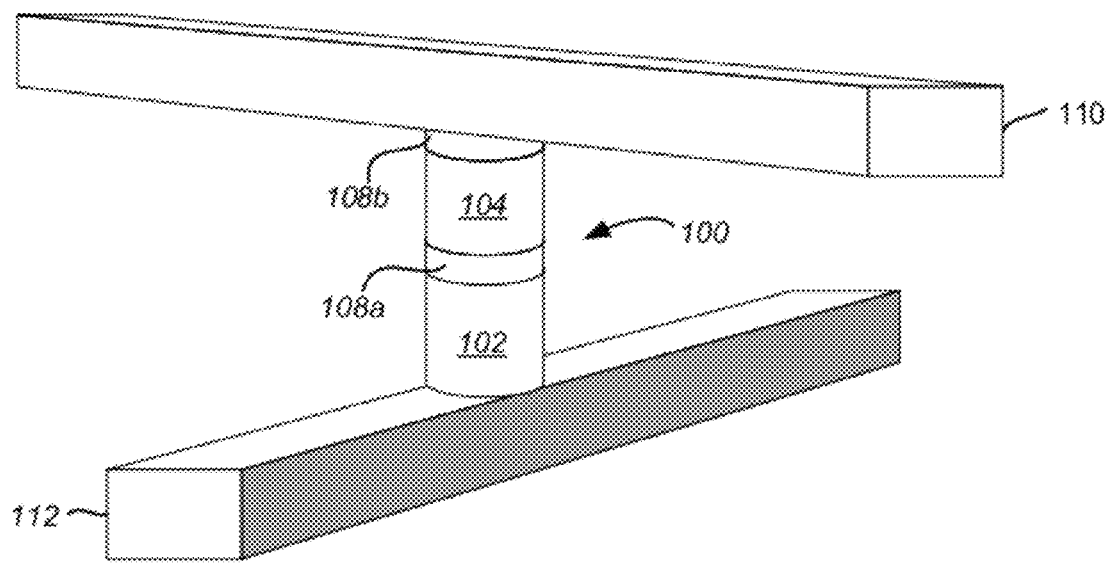
FIG. 1 depicts an exemplary structure for a non-volatile memory cell that can be used in accordance with embodiments of the present disclosure.

FIG. 1 depicts an exemplary structure for a non-volatile memory cell that can be used in accordance with embodiments of the present disclosure. A two-terminal memory cell 100 as depicted in FIG. 1 includes a first terminal portion connected to a first conductor 110 and a second terminal portion connected to a second conductor 112. The memory cell 100 includes a steering element 102 in series with a bottom electrode 108a, a state change element 104, a top electrode 108b to provide non-volatile data storage. Herein, the state change element 104 may also be referred to as a "switching material." During a set operation the voltage applied to the top electrode 108b is more positive than the voltage applied to the bottom electrode 108a. Note that during fabrication either the bottom electrode 108a or the top electrode 108b could be formed first. Herein, the bottom electrode 108a and the top electrode 108b may also be referred to as a "first electrode" and a second electrode. When doing so, the first electrode may refer to either the top electrode 108b or the bottom electrode 108a. Likewise, the second electrode may refer to either the top 108b or bottom electrode 108a. The steering element 102 can take the form of any suitable device exhibiting a nonlinear conduction current characteristic such as a diode. Thus, the steering element 102 may have a forward bias current that is substantially larger than a reverse bias current.

The state change element 104 will vary by embodiment and can include numerous types of materials to store data through representative physical states. For example, a semiconductor or other material having at least two levels of detectable resistance change (e.g., low to high and high to low) is used in one embodiment to form a passive storage element 100. In some embodiments, the state change element 104 is formed from metal oxide ($MeO_x$). Examples of suitable metal oxides include, but are not limited to, zirconium oxide, cesium oxide, and bismuth oxide. A wide variety of materials can be used for the electrodes 108a, 108b. Examples of suitable electrode materials include, but are not limited to, titanium nitride, oxidized titanium nitride, tantalum nitride, and oxidized tantalum nitride. The pairing of a suitable electrode material with the material for the state change element 104 is a challenging problem. Several combinations of such materials are disclosed herein.

Techniques are disclosed herein for treating an interface between the state change element 104 and at least one of the electrodes 108a and/or 108b to improve performance. In one embodiment, treating the interface alters the energy barrier height between the state change element 104 and at least one of the electrodes 108a, 108b. One such treatment is to increase the net negative charge at the interface by, for example, implanting negative ions. The treatment may increase the energy barrier height, which may reduce the work function requirement on the electrode 108 at the interface. Reducing the work function requirement on the electrode 108 allows use of an electrode material that has other desirable properties such as excellent oxidation resistance but that may have an otherwise undesirably low work function.

In some embodiments, at least one of the electrodes 108a, 108b has at least two regions formed from different materials. For example, one embodiment is a bi-layer top electrode 108b. The material for one of the layers may be selected for its work function and the material for the other layer may be selected for its resistance to oxidation. As an example, the layer nearest the state change element 104 may be selected for its resistance to oxidation, whereas the layer away from the state change element 104 may be selected for its work function. Depending on the materials selected and the thicknesses of the layers, the overall work function of the electrode top 108b may be much closer to the work function of the layer away from the state change element 104. Thus, the top electrode 108b may have a desired work function and a desired resistance to oxidation.

In some embodiments, at least one of the electrodes 108a, 108b is treated during fabrication in a manner that improves performance during memory cell operation. For example, the bottom electrode 108a is fabricated to increase the number of non-lattice oxygen ions. Having additional non-lattice oxygen ions may improve endurance of the storage device. In one embodiment, fabricating the memory cell involves processing at least one of the electrodes (e.g., the bottom electrode 108a) such that it is at least as amorphous at the state change element 104.

Following is an overview of functioning of the memory cell 100. By assigning logical data values to the various levels of resistance that can be set and read from state change element 104, memory cell 100 can provide reliable data read/write capabilities. As a discreet device or element may have a resistance and different resistance states, the terms resistivity and resistivity state are used to refer to the properties of materials themselves. Thus, while a resistance change element or device may have resistance states, a resistivity change material may have resistivity states.

A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset). Embodiments in accordance with the present disclosure can be used to set memory cells to a lower resistance state or to reset memory cells to a higher resistance state. While specific examples may be provided with respect to set or reset operations, it will be appreciated that these are mere examples and that the disclosure is not so limited.

It will be appreciated that other types of two-terminal nonvolatile memory cells can be used in embodiments. For example, the memory cells 100 of some embodiments may include additional state change elements. Also note that while the steering element 102 is depicted "below" the state change element 104, it can also be "above" the state change element 104.

Conductors 110 and 112 are typically orthogonal to one another and form array terminal lines for accessing an array of memory cells 100. The array terminal lines (also called array lines) at one layer may be termed word lines or X-lines. The array lines at a vertically adjacent layer may be termed bit lines or Y-lines. A memory cell 100 can be formed at the projected intersection of each word line and each bit line, and connected between the respective intersecting word line and bit line as shown for the formation of memory cell 100. A three-dimensional memory array which has at least two levels of memory cells 100 (i.e., two memory planes) may utilize more than one layer of word lines and/or more than one layer of bit lines. A monolithic three dimensional memory array is one in which multiple memory levels are formed above a single substrate, such as a wafer, with no intervening substrates.

Figure 2A:
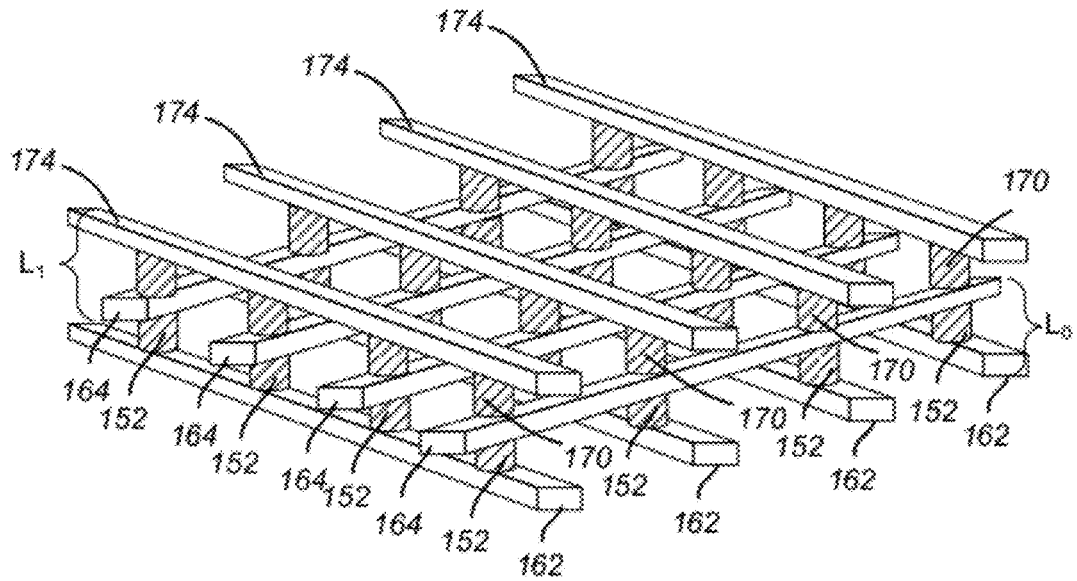
FIGS. 2A-2B depict a portion of an exemplary monolithic three-dimensional memory array that can be used in various embodiments.
Figure 2B:
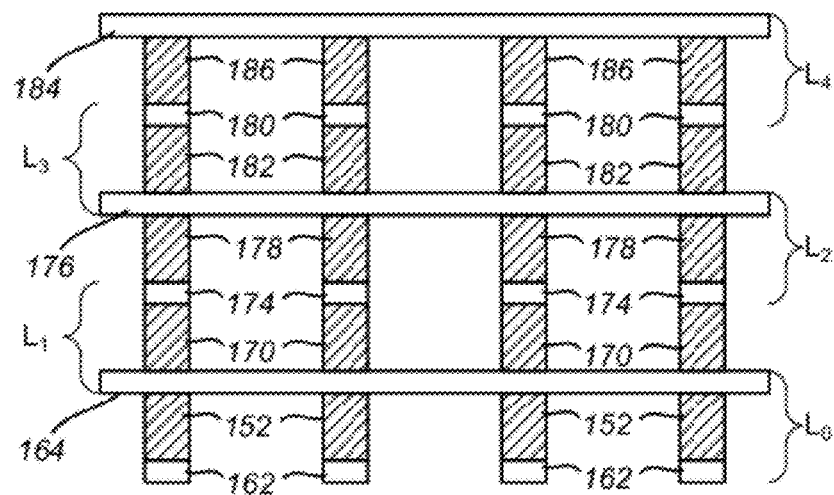

FIGS. 2A-2B depict a portion of an exemplary monolithic three-dimensional memory array that can be used in various embodiments. However, other memory structures can be used in accordance with various embodiments, including two-dimensional memory structures manufactured on, above, or within a semiconductor substrate. Both the word line and bit line layers are shared between memory cells in the structure depicted in the perspective view of FIG. 2A. This configuration is often referred to as a fully mirrored structure. A plurality of substantially parallel and coplanar conductors form a first set of bit lines 162 at a first memory level L0. Memory cells 152 at level L0 are formed between these bit lines and adjacent word lines 164. In the arrangement of FIGS. 2A-2B, word lines 164 are shared between memory layers L0 and L1 and thus, further connect to memory cells 170 at memory level L1. A third set of conductors form the bit lines 174 for these cells at level L1. These bit lines 174 are in turn shared between memory levels L1 and memory level L2, depicted in the cross-sectional view of FIG. 2B. Memory cells 178 are connected to bit lines 174 and word lines 176 to form the third memory level L2, memory cells 182 are connected to word lines 176 and bit lines 180 to form the fourth memory level L3, and memory cells 186 are connected to bit lines 180 and word lines 184 to form the fifth memory level L5. The arrangement of the diodes' polarity and the respective arrangement of the word lines and bit lines can vary by embodiment. Additionally, more or fewer than five memory levels can be used.

In one embodiment, the steering elements 102 of memory cells 170 are formed upside down relative to the steering elements 102 of the first level of memory cells 152. Also note that the bottom electrode 108a may be "above" the top electrode 108b in some cases and "below" it for other cases.

In an alternative embodiment, an inter-level dielectric can be formed between adjacent memory levels. In this alternative, no conductors are shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array. In other embodiments, some conductors are shared while others are not. For example, only the word lines or only the bit lines are shared in some configurations. A first memory level L0 can include memory cells between a bit line level BL0 and word line level WL0. The word lines at level WL0 can be shared to form cells at a memory level L1 that connect to a second bit line level BL1. The bit line layers are not shared so the next layer can include an interlayer dielectric to separate bit lines BL1 from the next level of conductors. This type of configuration is often referred to as half-mirrored. Memory levels need not all be formed having the same type of memory cell. If desired, memory levels using resistive change materials can alternate with memory levels using other types of memory cells, etc.

In one embodiment, word lines are formed using word line segments disposed on different word line layers of the array. The segments can be connected by a vertical connection to form an individual word line. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address. An example of such a configuration is described in U.S. Pat. No. 7,054,219, entitled, "Transistor Layout Configuration for Tight Pitched Memory Array Lines, which is hereby incorporated by reference in its entirety.

Figure 3:
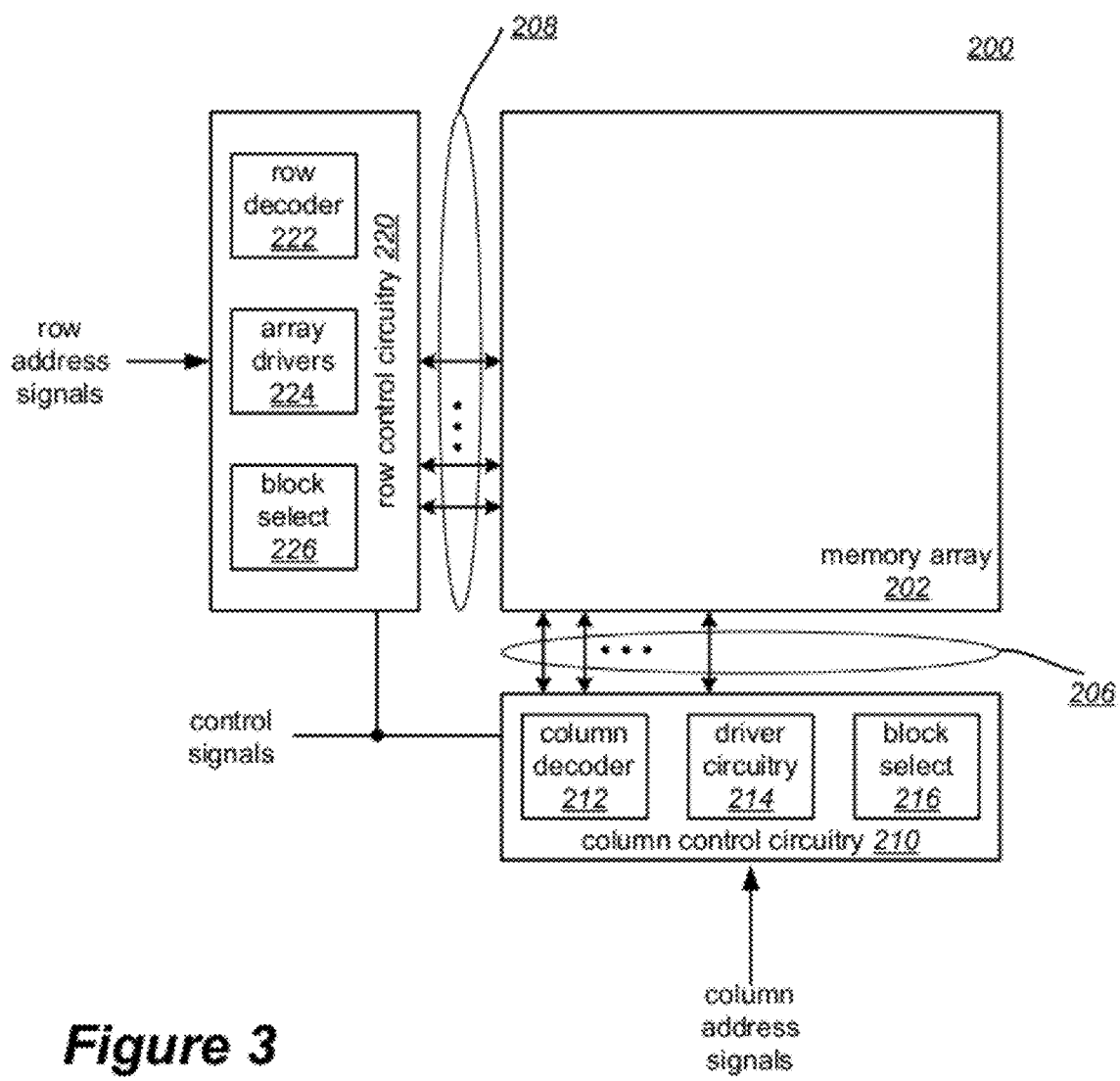
FIG. 3 is a block diagram of an integrated circuit including a memory array.

FIG. 3 is a block diagram of an integrated circuit including a memory array 202. The array terminal lines of memory array 202 include the various layer(s) of word lines organized as rows, and the various layer(s) of bit lines organized as columns. The integrated circuit 200 includes row control circuitry 220 whose outputs 208 are connected to respective word lines of the memory array 202. The row control circuitry receives a group of M row address signals and one or more various control signals, and typically may include such circuits as row decoders 222, array terminal drivers 224, and block select circuitry 226 for both read and write (i.e., programming) operations. The integrated circuit 200 also includes column control circuitry 210 whose input/outputs 206 are connected to respective bit lines of the memory array 202. The column control circuitry 206 receives a group of N column address signals and one or more various control signals, and typically may include such circuits as column decoders 212, array terminal receivers or drivers 214, block select circuitry 216, as well as read/write circuitry, and I/O multiplexers. Circuits such as the row control circuitry 220 and the column control circuitry 210 may be collectively termed control circuitry or array terminal circuits for their connection to the various array terminals of the memory array 202.

Integrated circuits incorporating a memory array usually subdivide the array into a sometimes large number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

FIGS. 4A-4C depict embodiments of memory cells 100 that have different combinations of materials for the state change element 104 and the electrodes 108a, 108b. In general, the memory cells 100 have a bottom electrode 108a, a state change element 104, and a top electrode 108b. The memory cells 100 may also have a steering element 102; however, that is not depicted in FIGS. 4A-4C. The steering element 102 may be adjacent to either electrode 108a, 108b. Moreover, for steering elements that have a forward bias current and a reverse bias current, the direction of the forward bias current may be either from the bottom electrode 108a to the top electrode 108b or from the top electrode 108b to the bottom electrode 108a.

The state change element 104 is formed from a switching material. In the embodiments of FIG. 4A-4C, the state change element 104 is a metal oxide (MeO$_x$). Specifically, the state change element 104 is ZrO$_x$ doped with YO$_x$ in the embodiment of FIG. 4A, CeO$_x$ in the embodiment of FIG. 4B, and BiO$_x$ in the embodiment of FIG. 4C. The CeO$_x$ and the BiO$_x$ may be doped.

Table 1 depicts combinations of materials that may be used for the top electrode 108b, state change element 104, and the bottom electrode 108a. Table 1 is organized around the selection of the material for the state change element 104. If the state change element 104 is ZrO$_x$, then the top electrode 108b may be LaMnO$_3$ (possibly doped with either Sr and/or Ca), TaCN, or TiCN. The bottom electrode 108a may be TiN, oxidized TiN (T(O)), TaN, or oxidized TaN (Ta(O)N). If the state change element 104 is CeO$_x$, then the top electrode 108b may be LaMnO$_3$ (possibly doped with either Sr and/or Ca), TaCN, or TiCN. The top electrode 108b may also be cobalt oxide or nickel oxide when the state change element 104 is CeO$_x$. If the state change element 104 is bismuth oxide, then the top electrode 108b may be LaMnO$_3$ (possibly doped with either Sr and/or Ca), cobalt oxide, nickel oxide, TaCN, or TiCN. Note that the table is not meant to exclude dopants that are not specifically mentioned.

TABLE 1

| Top electrode 108b | State Change Element 104 | Bottom electrode 108a |
|---|---|---|
| LaMnO$_3$, LaMnO$_3$ doped with Sr and/or Ca, TaCN, or TiCN | ZrO$_x$ doped with YO$_x$ | TiN, Ti(O)N, TaN, or Ta(O)N |
| LaMnO$_3$, doped LaMnO$_3$, Co oxide, Ni oxide, TaCN, or TiCN | CeO$_x$ or CeO$_x$ doped with gadolinium and/or samarium | TiN, Ti(O)N, TaN, or Ta(O)N |
| LaMnO$_3$, doped LaMnO$_3$, Co oxide, Ni oxide, TaCN, or TiCN | Bismuth oxide or doped bismuth oxide | TiN, Ti(O)N, TaN, or Ta(O)N |

When the state change element 104 is ZrO$_x$ doped with YO$_x$, the YO$_x$ may stabilize the ZrO$_x$ into the cubic close packed state at lower temperatures and may also introduce oxygen vacancies into the ZrO$_x$. In one embodiment, the state change element 104 is formed from a compound comprising Zr$_x$Y$_y$O$_z$, where z is within 25 percent more or 25 percent less of 2x, and the molar concentration of Y in Zr$_x$Y$_y$O$_z$ is between 5 percent and 15 percent.

Note that the material for the state change element 104 is not limited to the examples listed in Table 1. In one embodiment, the state change element 104 is a metal oxide in which the metal is not a transition metal. Note that cesium and bismuth are not transition metals. However, other metals that are not transition metals may also be used for the metal oxide state change element 104.

Note that it is possible to use other materials for the electrodes 108a, 108b than are listed in Table 1. In one embodiment, the state change element 104 is any of the state change elements listed in Table 1 and at least one of the electrodes 108a, 108b has one or more of the following properties. In one embodiment, it is the top electrode 108a that has at least one of the following properties.

1) a work function greater than 5 eV
2) a coefficient of thermal expansion (CTE) that is matched to the state change element within 5 percent; or
3) is resistant to oxidation.

Resistance to oxidation can be measured in the following ways. One way to measure how resistant a material is to oxidation is to measure the electrical resistance (in terms of sheet resistance) of the material after it has been exposed to rapid thermal oxidation (RTO). In one embodiment, an electrode material is considered resistant to oxidation if it has a sheet resistance of between $3 \times 10^{-8}$ ohm meters and $8.8 \times 10^{-4}$ ohm meters after an exposure to a rapid thermal oxidation (RTO) between a temperature of 400 C and 750 C. However, note that resistance to oxidation can be measured in an alternative manner. For example, resistance to oxidation can be measured in terms of the increase in resistance due to exposure to a RTO. In one embodiment, an electrode material is considered resistant to oxidation if it can survive a 750 C RTO with 10 percent or less increase to sheet resistance of the electrode material.

As previously discussed, the metal oxide state change element 104 may be a non-transition metal other than one listed in Table 1. In one embodiment in which the state change element 104 is a metal oxide other than a transition metal, at least one of the electrodes (e.g., the top electrode 108b) has one or more of the properties discussed above (work function greater than 5 eV, a coefficient of thermal expansion (CTE) that is matched to the state change element within 5 percent, or is resistant to oxidation).

The following discussion provides possible reasons why the above selection of materials for the electrodes 108a, 108b and state change element 104 may result in improved memory cells. The inventors have discovered that one or more of the following properties for the state change element 104 and one or more of the electrodes 108a, 108b may be beneficial. It is not required that the state change element 104 or electrodes 108a, 108b have all of the following properties. Also, note that it is not required that both electrodes 108a, 108b have these qualities. In other words, different qualities may be desirable in the bottom electrode 108b than the top electrode 108a. For example, depending on the voltages applied (and current through) the memory cell 100 when setting and resetting the memory cell 100 different qualities may be desirable for each electrode 108a, 108b.

1) The metal in the $MeO_x$ material should have multiple oxidation states. The set and reset process may involve creating and/or annihilating oxygen vacancies, as well as "moving" the oxygen vacancies from one electrode towards the other. More oxidation states may make it easier to form and move oxygen vacancies during set and reset operations.

2) The ionic conductivity of the $MeO_x$ should be high. The set and reset process may involve moving ions towards or away from the state change element/electrode interface. Hence, good ionic conductivity may be beneficial.

3) The dielectric constant of the $MeO_x$ should be low. This may promote good memory cell endurance because a lower concentration of oxygen vacancies may be sufficient to produce a certain change in energy band-bending for $MeO_x$ materials with lower dielectric constants. Also, if fewer oxygen vacancies need to be formed and annihilated for reset operation, memory cell endurance should be greater and reset current should be reduced. A possible reason for needing a lower concentration of oxygen vacancies is that materials with low dielectric constants may need less charge to be stored at the top electrode/state change element interface.

Note that during reset, the current may eliminate oxygen vacancies. That is, oxygen vacancies are moved away from the top electrode/state change element interface.

4) There should be a large energy barrier height between the top electrode 108b and the $MeO_x$ material's conduction band.

5) The $MeO_x$ material should be able to withstand a high temperature reset pulse without degradation. Note that there may be substantial Joule heating during the reset pulse.

6) One or both electrodes 108 should withstand high temperatures without getting oxidized during the reset pulse. The top electrode 108b may need to withstand greater temperature during a reset pulse than the bottom electrode 108a.

7) One or both electrodes 108 should have a co-efficient of thermal expansion (CTE) which is matched with the $MeO_x$ material. This ensures that cycling endurance after multiple high temperature reset pulses is good. In one embodiment, the top electrode 108b has a coefficient of thermal expansion (CTE) that within 5 percent of the CTE of the state change element 104.

Figure 5:
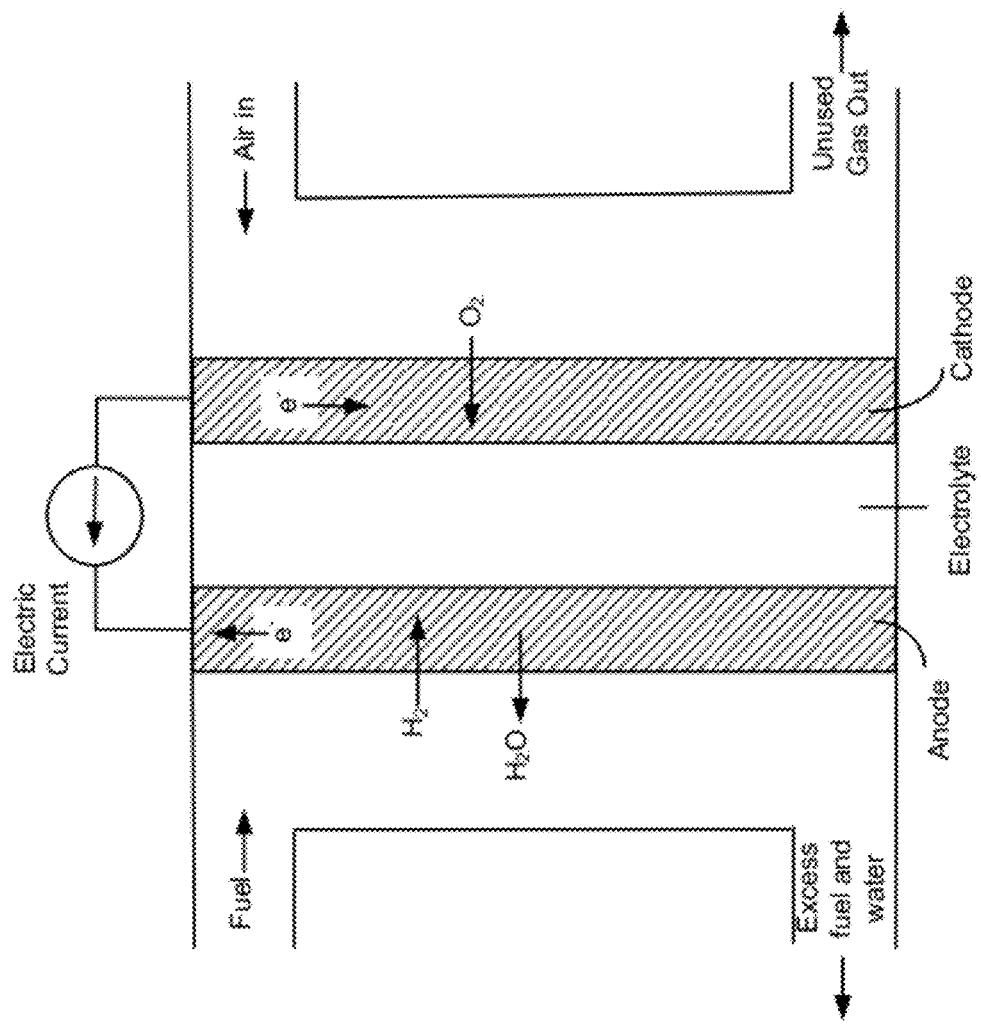
FIG. 5 depicts a conventional fuel cell.

Fuel cells have qualities that may be similar to the above mentioned qualities for ReRAM devices. FIG. 5 depicts a conventional fuel cell. In general, the fuel cell has an anode, a cathode, and a solid electrolyte. The solid electrolyte may be doped $ZrO_x$. The cathode may be $LaMnO_3$.

Basic operation of the fuel cell is as follows. There is a fuel intake near the anode, and excess fuel and water is output near the anode. Air is input and unused gas is output near the cathode. The chemical reaction at the anode is given by Equation 1, and the chemical reaction at the cathode is given by Equation 2.

$$O^{2-} + H_2 \rightarrow H_2O \qquad \text{Eq. 1}$$

$$O_2 + 2e^- \rightarrow O^{2-} \qquad \text{Eq. 2}$$

Characteristic for the solid electrolyte may be: good ionic conductivity, multiple oxidation states, and stable at 700-800 C. Characteristic for the cathode may be: CTE matched with the solid electrolyte, and does not react with the solid electrolyte and oxidize even at 700-800 C. Based on the foregoing, the material systems that are used in fuel cells may be good candidates for use in ReRAM devices.

One of the biggest challenges with taking ReRAM chips into production is finding a material that is suitable for the top electrode 108b. One material that has at least some desired properties for the top electrode 108b is platinum (Pt). However, it is desirable to find materials that are an alternative to Pt. The following may be desired properties for the top electrode 108b.

1) The top electrode 108b should have a high work function so that a good rectifying contact between the top electrode 108 and $MeO_x$ material is formed. This contact may become more ohmic as oxygen vacancies accumulate. Platinum has a work function around 5.5 eV. Therefore, it may be desirable that alternative materials for the top electrode 108b have a work function around the same range.

2) During the reset pulse, the interface between the top electrode 108b and the $MeO_x$ material heats up due to Joule heating. This may result in oxygen vacancy annihilation and diffusion of oxygen ions from the bottom electrode 108a to the top electrode/$MeO_x$ interface. The top electrode 108b should not react with oxygen at temperatures that might be reached during reset. For some memory cells, the top electrode 108b might reach 600 C during reset. Note that the temperature that the top electrode 108b might reach during reset depends on many factors and will vary from one design to the next. Therefore, 600 C should be interpreted as one example; the top electrode 108b might reach a lower or higher temperature during reset.

One such material that meets both the above requirements is TaCN. TaCN is used in CMOS-metal gate applications and is deposited at low temperatures. The work function of TaCN is tunable by changing the percentage of different constituent elements such as Ta, C and N. One embodiment is a ReRAM device with a TaCN top electrode 108b, ZnMnO as the MeO$_x$ material and TiN (or oxidized TiN)) as the bottom electrode 108a.

There are other materials such as TiSiN, TaSiN, TiC, TaC, TiAlN, and TaAlN which have excellent oxidation resistance but have work functions that are significantly lower than 5.5 eV. However, such materials with work functions that are lower than 5.5 eV may be successfully used in the top electrode 108b by treating the interface between the top electrode 108b and the state change element 104. Treating the interface in one embodiment changes the barrier height between the top electrode 108b and the state change element 104.

Figure 6A:
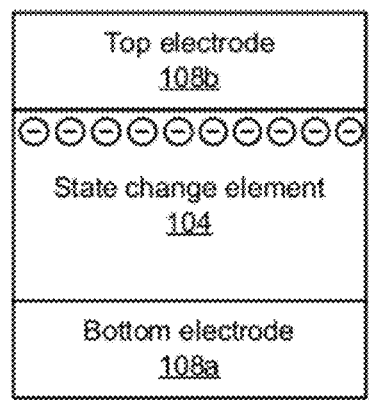
FIG. 6A depicts one embodiment of a memory cell in which treating the interface includes adding negative charges to the interface between the state change element and the top electrode.

FIG. 6A depicts one embodiment of a memory cell 100 in which treating the interface includes adding negative charges to the interface between the state change element 104 and the top electrode 108b. The negative charges at the interface may increase the barrier height and, therefore, could reduce the work function requirement on the top electrode 108b.

Figure 6B:
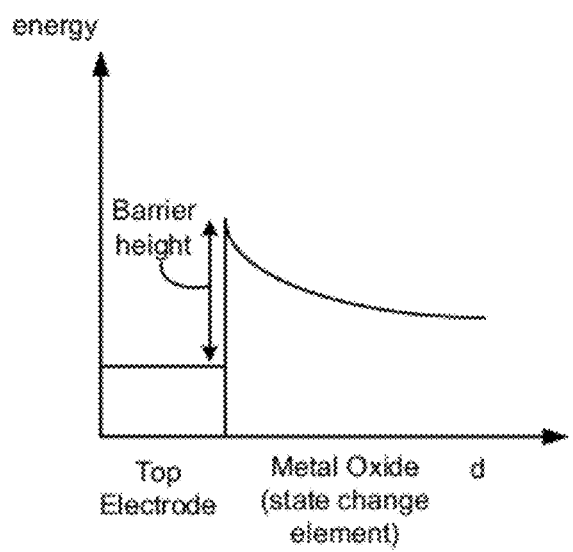
FIG. 6B depicts an energy band diagram for the top electrode/state change element interface without added negative charges.
Figure 6C:
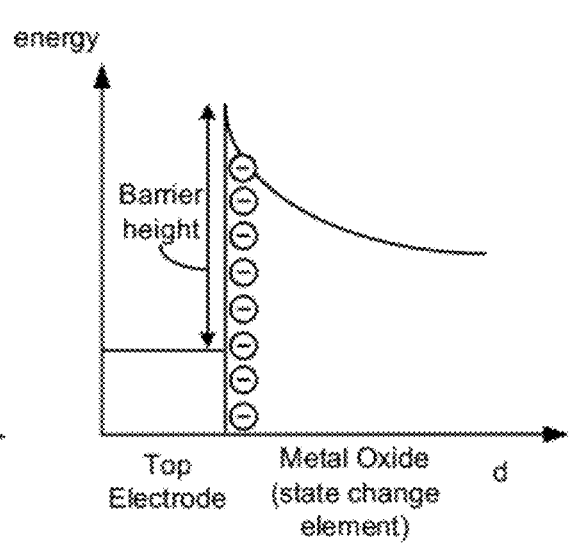
FIG. 6C depicts the top electrode/state change element interface with added negative charges to show the increase in the barrier height.

FIG. 6B depicts an energy band diagram for the top electrode/state change element interface without added negative charges. FIG. 6C depicts the top electrode/state change element interface with added negative charges to show the increase in the barrier height. The state change element 104 may be a metal oxide. Equation 3 describes the barrier height.

$$\phi_{b\text{-}TE} = \phi_{TE} - \chi_{STE} \qquad \text{Eq. 3}$$

In Equation 3, $\phi_{b\text{-}TE}$ is the barrier height of the top electrode/state change element junction, $\phi_{TE}$ is the work function of the top electrode 108b, and $\chi_{STE}$ is the electron affinity of the state change element 104.

Figure 7A:
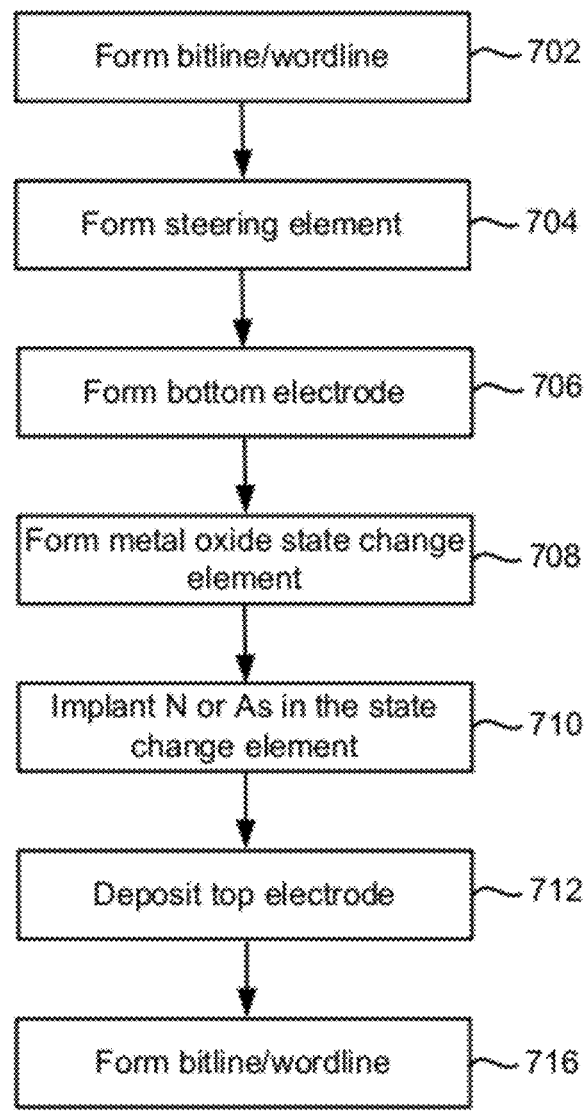
FIG. 7A depicts one embodiment of a process for forming a memory array with a memory cell having negative charges at the interface between the state change element and the top electrode.

FIG. 7A depicts one embodiment of a process 700 for forming a memory array with a memory cell having negative charges at the interface between the state change element 104 and the top electrode 108b. As previously discussed this may reduce the barrier height at the top electrode/state change element interface, which may reduce work function requirements on the material used to form the top electrode 108b. Thus, a material with a lower work function but other desirable properties, such as resistance to oxidation may be used for the top electrode 108b. Referring now to the flowchart in FIG. 7A, in step 702, a bottom wordline/bitline 112 is formed. The wordline/bitline 112 may be formed from Aluminum, although other materials such as tungsten or another conductor could be used. Step 702 includes depositing the material for the wordline/bitline 112, patterning, and etching. Techniques for patterning and etching wordlines/bitlines are well known and will not be discussed in detail.

In step 704, a steering element 102 is formed. Note that the steering element 102 may include several different regions of materials. For example, the steering element 102 may be a metal-insulator-insulator-metal (MIIM) diode. Details of forming MIIM diodes are discussed in U.S. patent application Ser. No. 12/240,766, tilted, "Improved MIIM diodes" filed on Sep. 29, 2008; U.S. patent application Ser. No. 12/240,785, tilted, "MIIM diodes having stacked structure" filed on Sep. 29, 2008, all of which are hereby incorporated by reference in their entirety for all purposes. However, the steering element 102 is not required to be a MIIM diode.

In step 706, a bottom electrode 108a is formed. The bottom electrode 108a may be formed from TiN. In one embodiment, the TiN is oxidized to form oxidized TiN. The formation of the bottom electrode 108a can be achieved by depositing TiN (or another material) and patterning and etching. The bottom electrode 108a can be deposited using a variety of techniques including, but not limited to, chemical vapor deposition (CVD), physical vapor deposition (PVD), atomic layer deposition (ALD), and sputtering. The bottom electrode 108a forms an electrical connection to the steering element 102 that was formed in step 704.

In step 708, a metal oxide state change element 104 is formed. Many different types of metal oxide state change elements can be formed in this step. Example materials for the MeO$_x$ have already been discussed. The MeO$_x$ can be deposited using a variety of techniques including, but not limited to, chemical vapor deposition (CVD), physical vapor deposition (PVD), atomic layer deposition (ALD), and sputtering.

In step 710, a material such as nitrogen or arsenic is implanted into the state change element 104. For example, nitrogen ions can be implanted in the state change element 104 at a depth and concentration that is controlled by the energy and dose of nitrogen. The energy at which the ions are implanted controls the depth. A purpose of the dopant is to increase the net negative charge near the surface of the state change element 104. Thus, the dopant does not need to be nitrogen or arsenic as other dopants may achieve this purpose.

In step 712, a top electrode 108b is formed. In one embodiment, the top electrode 108b is formed from TiSiN. In one embodiment, the top electrode 108b is formed from TaSiN. Other materials such as TaCN, TiCN, TaAlN, or TiAlN might be used for the top electrode. Note that the work function of these materials may be below 5.5 eV. However, due to the charge layer that was formed in step 710, the barrier height between the top electrode 108b and the state change element 104 is reduced. The top electrode 108b can be deposited using a variety of techniques including, but not limited to, chemical vapor deposition (CVD), physical vapor deposition (PVD), atomic layer deposition (ALD), and sputtering.

In step 716, a top bitline/wordline 110 is formed. The wordline/bitline 110 may be formed from Aluminum, although other materials could be used. Step 716 includes depositing the material for the wordline/bitline, patterning, and etching. Techniques for patterning and etching wordlines/bitlines are well known and will not be discussed in detail.

Figure 7B:
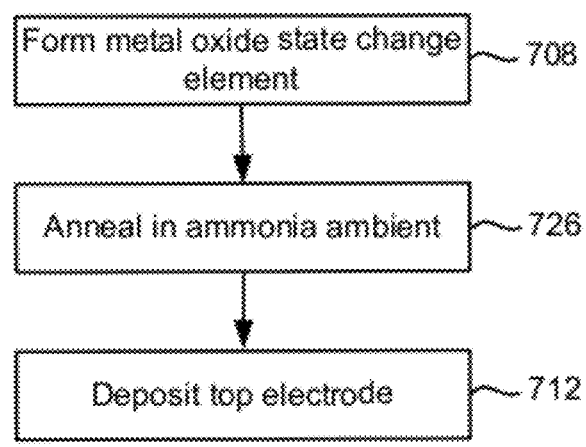
FIG. 7B depicts one embodiment of a process for treating the top/electrode/state change element interface of a memory cell.

FIG. 7B depicts one embodiment of a process for treating the top/electrode/state change element interface of a memory cell. The process begins in step 708, in which a metal oxide state change element 104 is formed. This step is similar to step 708 of FIG. 7A.

In step 726, the state change element 104 is annealed in an ammonia ambient. Annealing in ammonia causes nitrogen ions to form in the state change element 104. In one embodiment, the temperature range for the anneal may be between 350-850 C. However, a higher or lower temperature might be used. In one embodiment, the temperature range is between 450-650 C. Thus, a negative charge layer may be formed near the surface of the state change element 104. As an alternative to ammonia, the ambient for the annealing of step 726 may be forming gas. In one embodiment, the forming gas is a mixture of oxygen and nitrogen.

In step 712, the top electrode is formed over the state change element 104. This step may be similar to step 712 shown in FIG. 7B. After step 712, processing may continue as depicted in FIG. 7A.

Figure 8:
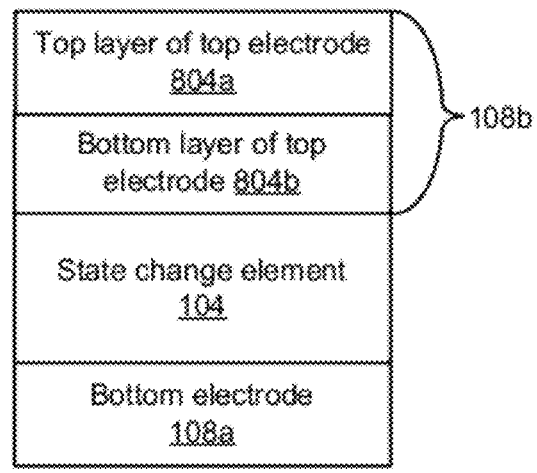
FIG. 8 depicts one embodiment of a memory cell having a bi-layer top electrode.

One technique for improving the top electrode 108b is to form the top electrode 108b from multiple materials that contribute different desired properties. FIG. 8 depicts one embodiment of a memory cell having a bi-layer top electrode 108a. The material for the bottom layer 804b of the top electrode 108b may be selected for its resistance to oxidation. The material for the top layer 804b of the top electrode 108b may be selected for its work function.

Figure 9:
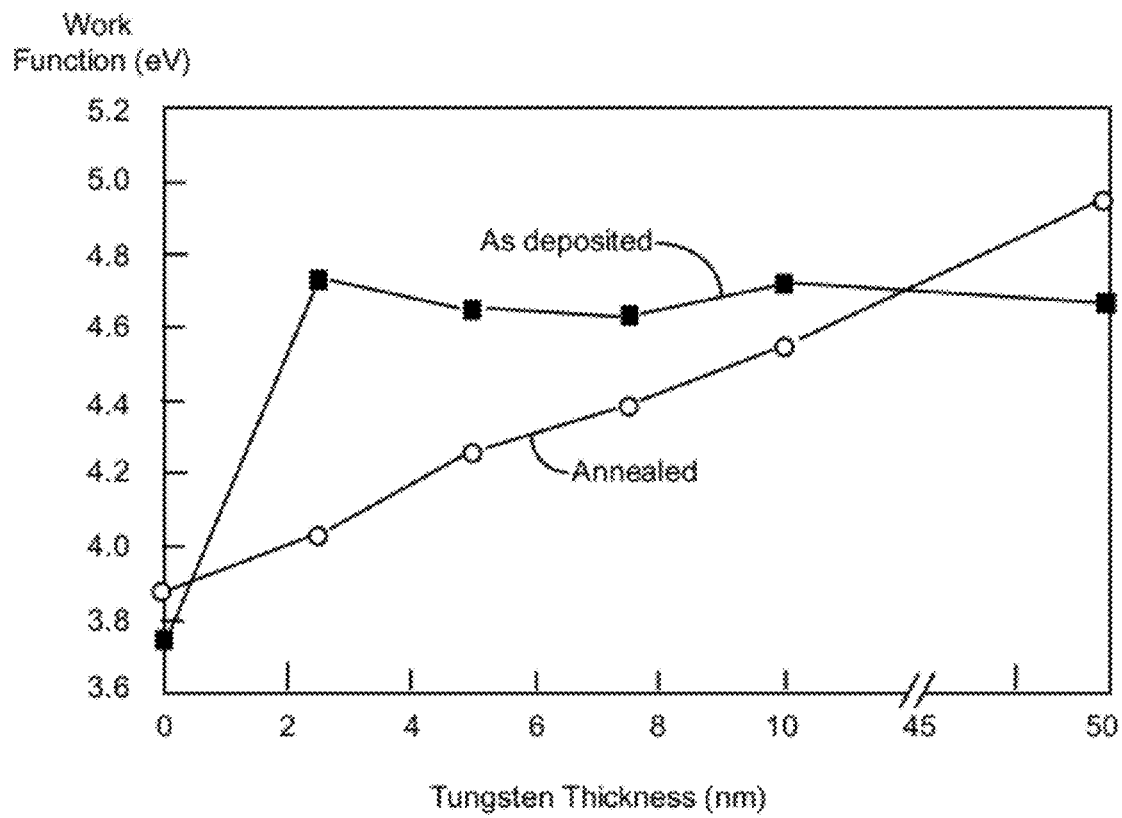
FIG. 9 is a graph depicting the work function of a bilayer electrode as a function of the thickness of the two layers.

When a bilayer metal film is used as an electrode 108, the work function of the electrode 108 may be determined by the work functions of both metals forming the bilayer stacks as well as the thickness of the bottom metal film. The graph in FIG. 9 depicts the work function of a bilayer electrode as a function of the thickness of the two layers. The electrode has an upper layer of titanium and a lower layer of tungsten. The thickness of the tungsten (lower layer) in nanometers is along the x-axis. The origin corresponds to a single layer electrode formed of titanium. The rightmost portion of the graphs correspond to a single layer electrode formed of tungsten. The points in-between correspond to bi-layer electrodes. Note that as the tungsten is made thicker, the titanium is made thinner. The y-axis is the work function in eV.

One curve depicts the work function of the bi-layer electrode after depositing the materials (no annealing). The other curve depicts the work function after annealing at 400 C. Note that the work function for an electrode formed only of titanium is about 3.7 eV-3.9 eV depending upon whether or not annealing has been performed. Also note that the work function for an electrode formed only of tungsten is about 4.6 eV-4.8 eV depending upon whether or not annealing has been performed. However, for the bi-layer electrode the work function is about 4.7 eV regardless of the relative thickness of the tungsten or titanium. Note that this is close to the work function of the tungsten. Thus, in this example the work function of the bi-layer electrode is primarily determined by the work function of tungsten regardless of the relative thicknesses of the tungsten and titanium when no annealing is performed. However, if the bi-layer electrode is annealed, the curve of the work function is quite different. In this case, the work function gradually increases as the thickness of the tungsten (lower layer) is increased. Thus, for a thin tungsten layer the work function is very close to that of titanium, if annealing has been performed.

In one embodiment, the material for the bottom layer 804b of the top electrode 108b of the memory cell is selected such that it has excellent oxidation resistance, which may be important for endurance after multiple reset pulses. An example of such a material is TiSiN. In one embodiment, the material for the top layer 804a of the top electrode 108a is selected based on work function considerations. An example of such a material is TiAlN. In one embodiment, annealing is performed after depositing the material for both the bottom layer 804b and the top layer 804a of the top electrode 108b. An example temperature for the anneal is 400 C, although a higher or lower temperature could be used. Note that annealing is not required.

One technique to improve the bottom electrode 108a may be to increase the number grain boundaries in the bottom electrode 108a. One embodiment is forming the bottom electrode 108a in a way that increases the number of grain boundaries. The grain boundaries may serve as receptacle for oxygen ions. One embodiment is forming the bottom electrode 108a in a way that increases the number of oxygen ions in the bottom electrode 108a.

The bottom electrode 108a for some embodiments of memory cells may act as an oxygen reservoir. During the set operation, oxygen ions at the top electrode/MeO$_x$ interface may move to the bottom electrode 108a and get trapped in the grain boundaries of the bottom electrode 108a. As an example, the bottom electrode 108a may be TiN. During the reset operation, oxygen ions that are trapped in the grain boundaries of the bottom electrode 108a may move to the top electrode/MeO$_x$ interface and react with oxygen vacancies there to reform the MeO$_x$. Also note that this may result in breaking conductive filaments there were due the oxygen vacancies.

In one embodiment, forming the bottom electrode 108a includes depositing a TiN layer and heating in oxygen before MeO$_x$ deposition to form the state change element 104. This results in an oxygen rich bottom electrode 108a, which may improve endurance. Heating the bottom electrode 108a in oxygen may force oxygen to accumulate in grain boundaries of the (TiN) bottom electrode 108a. Endurance of the memory cell may be improved because a significant endurance fail mode may be insufficient non-lattice oxygen ions to react with oxygen vacancies to break conductive filaments.

In one embodiment, the bottom electrode 108a is fabricated in a way to increase the number non-lattice oxygen ions in order to increase endurance of the ReRAM device. Increasing the number non-lattice oxygen ions may be achieved by forming a bottom electrode 108a with more grain boundaries. More grain boundaries may allow for more oxygen ions in the bottom electrode 108a. Various techniques can be used to increase the number of grain boundaries. For example, the deposition temperature and power can be selected such that there are more grain boundaries for oxygen ions when the electrode is heated in an oxygen ambient. As one example, depositing the material for the lower electrode 108a at a lower temperature can lead to more grain boundaries. As another example, using a lower chuck temperature when depositing the bottom electrode 108a may cause the bottom electrode 108a to form with smaller grains and hence more grain boundaries. As another example, increasing the power when depositing the bottom electrode 108a may cause the bottom electrode 108a to form with more grain boundaries. In one embodiment, the bottom electrode 108a is deposited with PVD, which may result in more grain boundaries (as compared to some other deposition techniques). In one embodiment, a material is implanted in the bottom electrode 108a to increase the degree of amorphization of the bottom electrode 108a. As an example, argon may be implanted.

Figure 10:
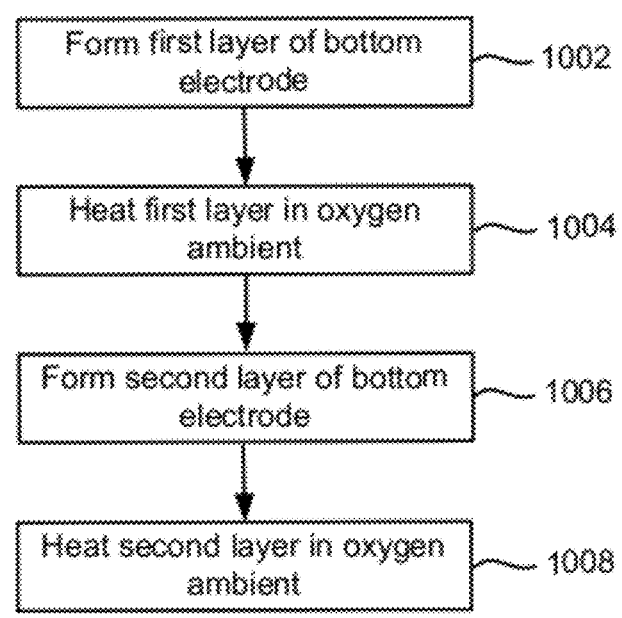
FIG. 10 is a flowchart depicting steps of one embodiment of forming a bottom electrode 108a to increase the amount of grain boundaries and oxygen ions.

FIG. 10 is a flowchart depicting steps of one embodiment of forming a bottom electrode 108a to increase the amount of grain boundaries and oxygen ions. In step 1002, a first layer of the bottom electrode 108a is deposited. The bottom electrode 108a may be deposited using PVD; however, this is not a requirement. Note that the power and temperature can be selected to result in a high degree of amorphization (or large number of grain boundaries). In one embodiment, the material for the bottom electrode 108a is TiN. However, another material such as TaN might be used. In step 1004, the first layer is heated in an oxygen ambient. Such heating may cause oxygen ions to become stored within the grain boundaries of the first layer of the bottom electrode 108a.

In step 1006, a second layer of the bottom electrode 108a is deposited. This may be the same material as deposited in step 1002. The second layer may be deposited in a manner that results in a high degree of amorphization. In step 1008, the second layer is heated in an oxygen ambient, which may cause oxygen ions to become stored within grain boundaries of the second layer of the bottom electrode 108a.

In one embodiment, the bottom electrode 108a is formed such that its degree of amorphization is at least as great as the degree of amorphization of the state change element 104. The degree of amorphization may be measured at full width half max for an X-ray diffraction (XRD) spectra. In one embodiment, the bottom electrode 108*a* is formed such that its degree of amorphization is either at least as great as the degree of amorphization of the state change element 104 or no more than 5 percent less than the degree of amorphization of the state change element 104.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A storage device comprising:
    a memory cell comprising:
    a bottom electrode;
    a metal-oxide state change memory element in contact with the bottom electrode, wherein the metal-oxide state change memory element comprises ZnMnO;
    a top electrode in direct contact with the metal-oxide state change memory element, the top electrode comprises TaCN; and
    a steering device in series with the bottom electrode, the metal-oxide state change memory element, and the top electrode.

2. The storage device of claim 1 wherein the bottom electrode comprises at least one of TiN or oxidized TiN.

3. The storage device of claim 1 wherein the bottom electrode comprises TiN.

4. The storage device of claim 1 wherein the bottom electrode comprises TiON.

5. A storage device comprising:
    a plurality of first conductors serving as bit lines;
    a plurality of second conductors serving as word lines;
    a plurality of memory cells between ones of the first conductors and ones of the second conductors;
    an individual memory cell comprising;
    a bottom electrode;
    a metal-oxide state change memory element in contact with the bottom electrode; and
    a top electrode in direct contact with the metal-oxide state change memory element, the top electrode comprises a first region and a second region, the first region is directly adjacent to the state change element, the first region comprises TiSiN, the second region comprises TiAlN.

6. The storage device as recited in claim 5, further comprising a steering device in series with the bottom electrode, the state change element, and the top electrode.

7. A method for forming a storage device, the method comprising:
    forming a bottom electrode;
    forming a metal-oxide state change memory element in contact with the bottom electrode, wherein the metal-oxide state change memory element comprises ZnMnO;
    forming a top electrode in direct contact with the metal-oxide state change memory element, the top electrode comprises TaCN; and
    forming a steering device in series with the bottom electrode, the metal-oxide state change memory element, and the top electrode.

8. The method for forming a storage device of claim 7 wherein the bottom electrode comprises at least one of TiN or oxidized TiN.

9. The method for forming a storage device of claim 7 wherein the bottom electrode comprises TiN.

10. The method for forming a storage device of claim 7 wherein the bottom electrode comprises TiON.

11. A method for forming a storage device comprising:
    forming a plurality of first conductors to serve as word lines;
    forming a plurality of second conductors to serve as bit lines;
    forming plurality cells between ones of the plurality of first conductors and ones of the plurality of second conductors, wherein forming an individuals memory cell comprises;
    forming a bottom electrode;
    forming a metal-oxide state change memory element in contact with the bottom electrode;
    depositing material for a top electrode in direct contact with the metal-oxide state change memory element, the material for the top electrode comprises a first region and a second region, the first region is directly adjacent to the metal-oxide state change memory element, the first region comprises TiSiN, the second region comprises TiAlN; and
    performing a thermal anneal after depositing the material for the top electrode.

12. The method of claim 11, wherein the thermal anneal is performed to establish a work function of the top electrode.

* * * * *